(12) United States Patent
Kraus et al.

(10) Patent No.: US 9,997,379 B2
(45) Date of Patent: Jun. 12, 2018

(54) METHOD AND APPARATUS FOR WAFER WET PROCESSING

(75) Inventors: Harald Kraus, Villach (AT); Marco Nardoni, Villach (AT); Michael Brugger, Millstatt (AT)

(73) Assignee: LAM RESEARCH AG, Villach (AT)

( * ) Notice: Subject to any disclaimer, the term of this patent is extended or adjusted under 35 U.S.C. 154(b) by 1732 days.

(21) Appl. No.: 12/956,988

(22) Filed: Nov. 30, 2010

(65) Prior Publication Data
US 2012/0131815 A1 May 31, 2012

(51) Int. Cl.
*H01L 21/67* (2006.01)

(52) U.S. Cl.
CPC .............................. *H01L 21/67051* (2013.01)

(58) Field of Classification Search
CPC .................................................. H01L 21/67051
USPC .................................. 34/443, 329, 337, 357
See application file for complete search history.

(56) References Cited

U.S. PATENT DOCUMENTS

| | | |
|---|---|---|
| 4,903,717 A | 2/1990 | Sumnitsch |
| 5,513,668 A | 5/1996 | Sumnitsch |
| 6,096,233 A * | 8/2000 | Taniyama et al. ............... 216/92 |
| 6,273,104 B1 * | 8/2001 | Shinbara et al. ............ 134/25.4 |
| 6,354,832 B1 | 3/2002 | Yoshimura et al. |
| 6,485,531 B1 | 11/2002 | Schoeb |
| 6,796,316 B2 | 9/2004 | Park |
| 6,807,974 B2 * | 10/2004 | Ono et al. ...................... 134/153 |
| 2002/0170579 A1 | 11/2002 | Lammert et al. |
| 2003/0047192 A1 | 3/2003 | Ono et al. |
| 2004/0235308 A1 | 11/2004 | Sato et al. |
| 2005/0242064 A1 * | 11/2005 | Saito et al. ..................... 216/92 |
| 2008/0314870 A1 * | 12/2008 | Inoue et al. .................... 216/38 |
| 2009/0107400 A1 * | 4/2009 | Miya ............................. 118/715 |
| 2010/0206338 A1 * | 8/2010 | Kraus et al. .................... 134/30 |

FOREIGN PATENT DOCUMENTS

| | | |
|---|---|---|
| EP | 1213746 | 6/2002 |
| WO | 2007101764 | 9/2007 |
| WO | 2008041211 | 4/2008 |

OTHER PUBLICATIONS

Imai et al., "Effect of Dissolved Oxygen on Cu Corrosion in Single Wafer Cleaning Process", Japanese Journal of Applied Physics, vol. 48, 2009, 04C023-1-04C023-4.
Written Opinion of the International Searching Authority, dated Apr. 18, 2012, from corresponding PCT application.

* cited by examiner

*Primary Examiner* — Kenneth Rinehart

(57) ABSTRACT

A gas dispenser in a process module for wet processing of wafer-shaped articles is substantially smaller than the article to be processed and is movable laterally of the article as it dispenses inert gas above the article.

6 Claims, 4 Drawing Sheets

METHOD AND APPARATUS FOR WAFER WET PROCESSING

BACKGROUND OF THE INVENTION

1. Field of the Invention

The invention relates generally to an apparatus for treating surfaces of wafer-shaped articles, such as semiconductor wafers.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

With increasing miniaturization of the devices fabricated on semiconductor wafers, processing those wafers in an oxygen-containing atmosphere becomes more problematic. For example, when wafers undergo wet processing in stations that are open to the surrounding air, the oxygen content of the air causes unwanted corrosion of copper on the front side of the wafer. More specifically, dissolved oxygen in the chemistry leads to oxidation of copper and cap layers in advanced BEOL (back-end-of-line) technologies during the liquid dispense, leading to increased copper loss by dissolution of the generated oxides of copper. Lateral material loss is especially significant to degradation of device performance.

During processing on a single wafer spinning tool in an open environment the oxygen from the air can diffuse through the liquid layer on the wafer to the wafer surface, leading to additional copper oxidation and therefore additional copper loss. This effect is enhanced where the liquid layer is very thin, e.g. at the wafer edge. This is also shown for watermark formation during drying.

Oxidation of copper due to dissolved oxygen in the chemistry can be avoided by replacing the oxygen with an inert gas such as nitrogen. Similarly, watermark formation can be mitigated by reducing the oxygen in the environment during drying on single wafer spin tools.

U.S. Pat. No. 6,807,974 describes a chamber equipped with a gas injection section for that purpose. However, the structure described in that patent does not permit processing or rinsing liquids to be dispensed on the wafer while the inert gas is being introduced by the gas injection section. The gas injection section of this patent is moreover depicted as being of greater diameter than the wafer to be treated, and forms a lid for a sealed interior chamber.

U.S. Pat. No. 6,273,104 describes an apparatus for processing a substrate in which a vertically movable blocking plate of diameter slightly less than the workpiece dispenses nitrogen downwardly onto a wafer surface and is further equipped with a central nozzle for dispensing deionized water for rinsing the workpiece. As the blocking plate is fixed in a coaxial relationship with the workpiece, the relative lateral positions of the gas nozzles and liquid nozzle to the workpiece are fixed.

A need therefore exists for wafer processing stations in which the gas atmosphere can be controlled, yet which permit performing a variety of processes on a wafer loaded in the processing module.

SUMMARY OF THE INVENTION

The present invention provides a new approach to controlling the atmosphere in an apparatus for processing wafer-shaped articles, by providing a method and apparatus in which a gas dispenser is positioned above and facing a holder for the workpiece, with the area of the gas dispenser facing the workpiece being substantially less than that of the workpiece. The substantially smaller size of the gas dispenser relative to the holding area for the workpiece permits the gas dispenser to be mounted for lateral movement relative to the workpiece, such that, when the workpiece is a circular wafer, the gas dispenser can be moved radially across the wafer surface as gas is being dispensed therefrom.

The gas dispenser also preferably incorporates a liquid conduit terminating in a liquid nozzle directly downwardly toward the holder, so that liquid and gas may be dispensed alternately and/or simultaneously from the same dispenser, either during lateral movement of the dispenser relative to the holder, or after movement of the dispenser has been stopped at a predetermined position, or both.

The present inventors have surprisingly discovered that the present method and apparatus effectively prevent the above-described negative influence of oxygen, without the need of using a closed chamber, and despite the relatively small area of the dispenser relative to the workpiece.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
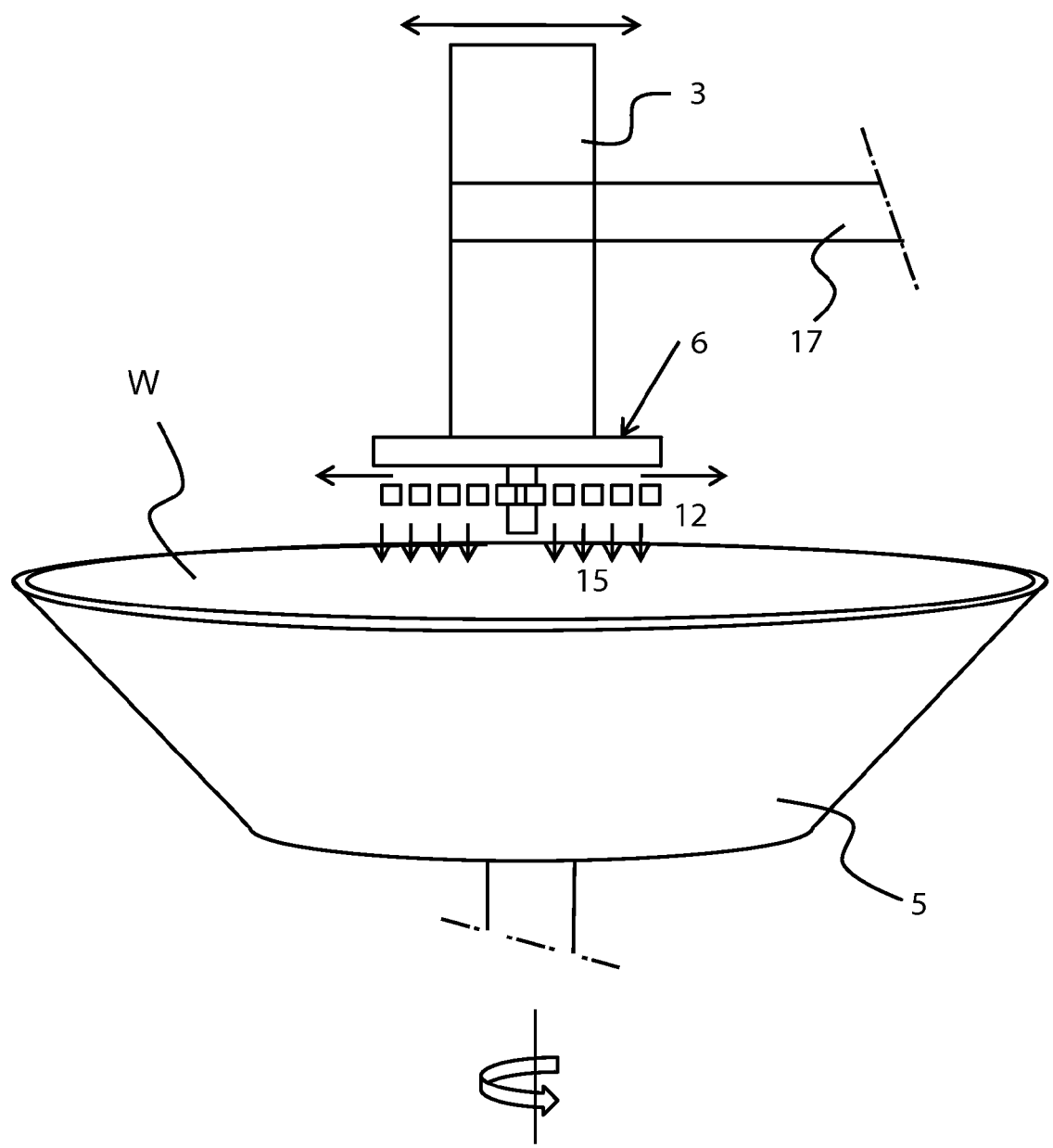
FIG. 1 is a schematic view of an apparatus according an embodiment of the present invention.

In FIG. 1, an apparatus according to the invention is embodied as a spin chuck 5 in a process module for single wafer wet processing of semiconductor wafers. The chuck 5 is designed to hold a semiconductor wafer W. Such chucks may be designed to hold a wafer W in a desired orientation on a balanced subjacent gas flow according to the Bernoulli principle, as in U.S. Pat. No. 4,903,717, or may hold the wafer entirely mechanically by gripping fingers (not shown) that engage the peripheral edge of the wafer.

Although the wafer itself is not a part of the claimed apparatus, such chucks are designed for wafers of a certain diameter, with 300 mm being the most prevalent wafer diameter in current use. Therefore, specification of the wafer diameter specifies the associated holding components of the chuck, e.g., a platform in excess of 300 mm diameter in which the gripping pins at their radially innermost positions describe a circle of approximately 300 mm diameter.

A gas dispenser 6 is mounted at the lower end of a liquid dispenser 3, and comprises an annular nozzle 12 that directs gas generally parallel to the surface of the wafer W, and a showerhead screen 15 serving as a vertical gas outlet that directs gas vertically downwardly toward the wafer surface.

The assembly of liquid dispenser 3 and gas dispenser 6 is mounted on an arm 17, which in turn is pivotally mounted to the process module. The assembly of liquid dispenser 3 and gas dispenser 6 may therefore be moved laterally relative to the chuck 5 and hence to the surface of a wafer W positioned on the chuck 5. The arm 17 is preferably also vertically movable, as the structure of the process module surrounding chuck 5 might require that the gas dispenser be elevated above those structures in order to be swung fully out of the way of the chuck 5, as may be the case when the chuck is loaded and unloaded.

Figure 2:
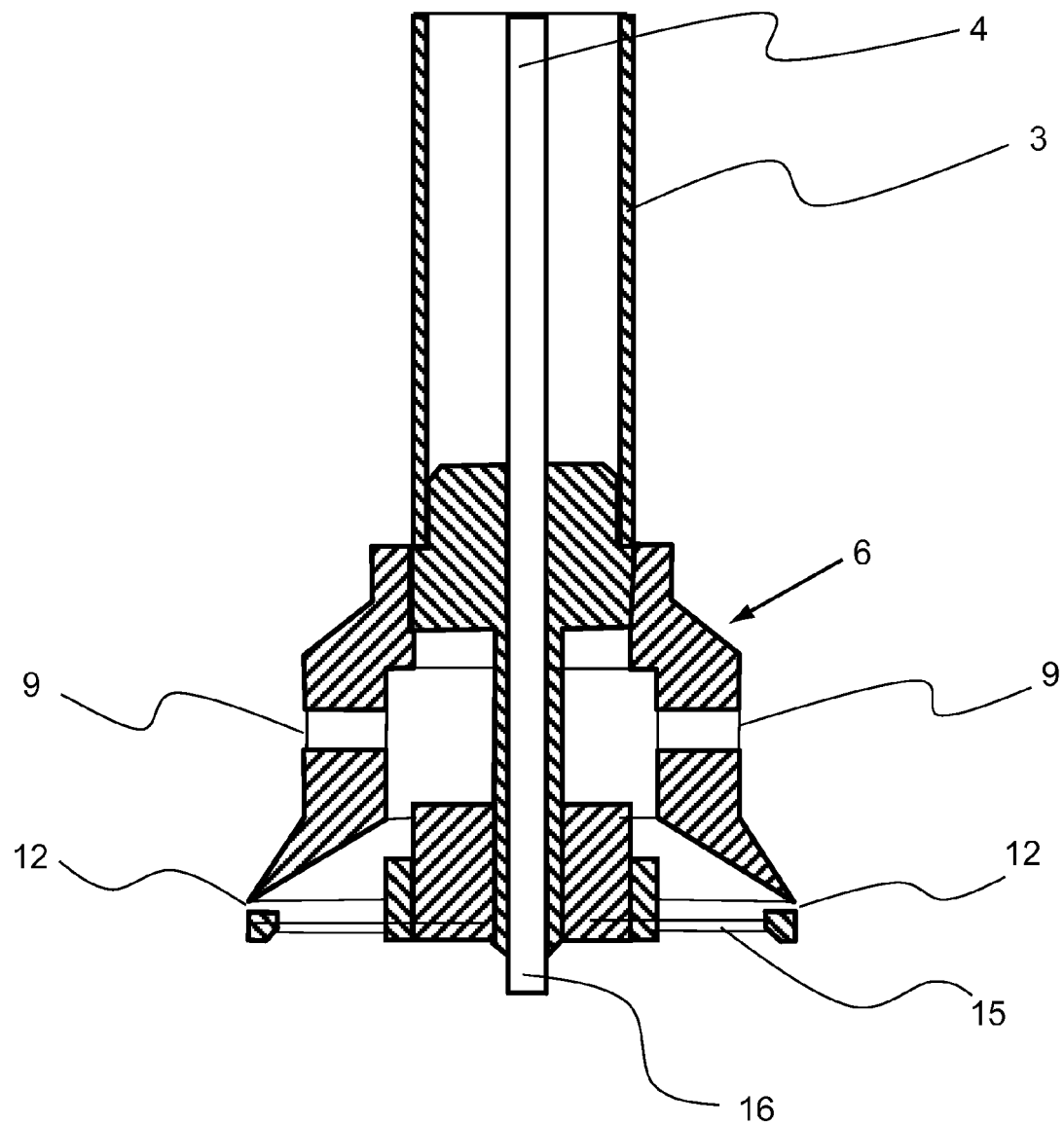
FIG. 2 is a vertical and axial cross sectional view of the gas dispenser used in the embodiment of FIG. 1.

Turning now to FIG. 2, it will be seen that liquid dispenser 3 comprises a liquid conduit 4 that passes coaxially through the center of gas dispenser 6, and terminates in a nozzle 16 for dispensing the cleaning liquid, etching liquid and/or rinsing liquid onto the upward-facing surface of wafer W.

Gas dispenser 6 comprises gas inlets 9 adapted to be connected to a source of inert gas, such as nitrogen (not shown). The gas dispenser of this embodiment is designed to output gas in two directions relative to the workpiece: annular nozzle 12 dispenses the inert gas substantially parallel to the workpiece surface. The purpose of that gas stream is to re-direct the air approaching the workpiece from above to the side, where the exhaust of the process module is located, to avoid oxygen from the environment getting to the wafer W (or to the liquid film on the wafer W that is generated by the liquid nozzle 16).

Showerhead screen 15 dispenses the inert gas vertically downwardly to the wafer surface so as to create an oxygen reduced or oxygen free environment on top of the wafer surface where the liquid hits the wafer, and to create an oxygen reduced or oxygen free environment where the liquid stream from nozzle 16 travels through open air, so that it cannot pick up oxygen along this path. Although these vertically oriented outlets are embodied as a screen 15 in the present embodiment, they could alternatively be embodied as a group of showerhead nozzles of any desired number.

Gas dispenser 6 can be of different shapes, e.g. oval, circular or rectangular. In the present embodiment it is circular.

Although not depicted in the drawings, process modules of this type, even when open to the surrounding ambient, are typically closely surrounded by exhaust levels and collector levels that serve to recover liquid flung radially outwardly off of the spinning wafer, as well as to vent gasses safely away from the process module. Therefore, a gas dispenser whose horizontal dimensions are nearly as large or larger than those of the wafer W will not be laterally movable relative to the wafer when in operating position.

Figure 3:
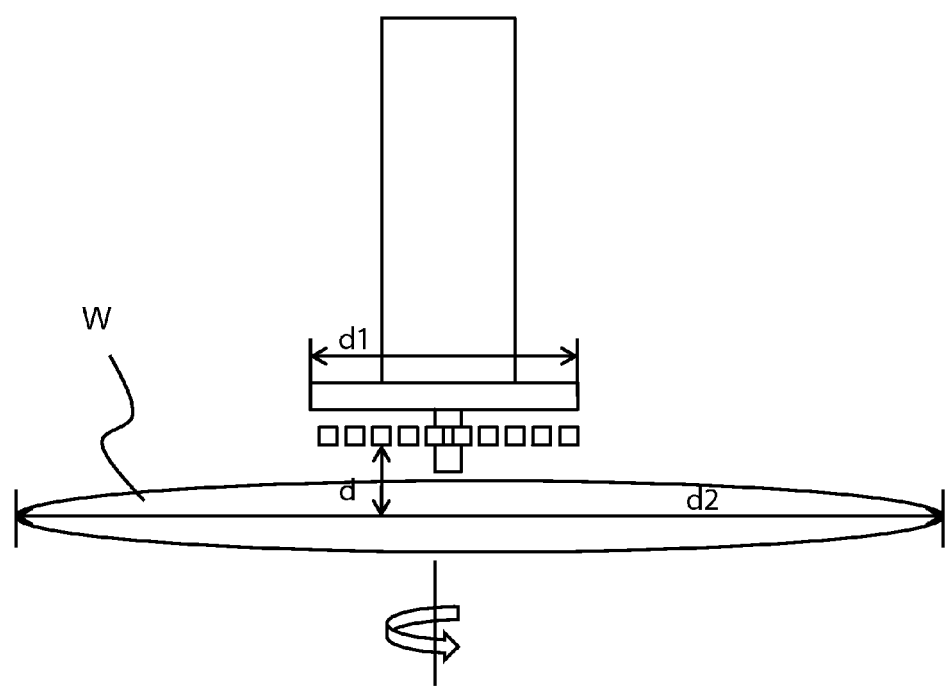
FIG. 3 is a view similar to FIG. 1, in which certain dimensional relationships between components of the depicted apparatus are highlighted.

In FIG. 3, "d" denotes the vertical separation between the gas dispenser 6 and the wafer W undergoing treatment; "$d_1$" denotes the width (or diameter) of the gas dispenser 6, in the direction parallel to the surface of wafer W, and "$d_2$" denotes the diameter of wafer W, in this case 300 mm. Thus, "$d_1$" is significantly less than "$d_2$". More particularly, the size of the gas dispenser 6 in the direction parallel to wafer W is selected such that the area of the gas dispenser will preferably be in the range of 5-50% of the area of wafer W, and more preferably in the range of 10-30% of the wafer area. Thus, for a 300 mm wafer and a circular gas dispenser 6, the value of "$d_1$" will preferably be in the range of 67-212 mm, and more preferably in the range of 95-165 mm.

According to the apparatus and method of the invention, the gas supply through gas dispenser 6 can be turned on independently from the process liquid dispensed through nozzle 16. Therefore, inert gas supplied through gas dispenser 6 can be used to replace the oxygen in the process chamber next to the wafer, e.g. before liquid dispense, by only dispensing the inert gas. Alternatively, inert gas and process liquid can be dispensed simultaneously, to create an inert gas atmosphere next to the wafer during the process liquid dispense. To enhance the effect an additional liquid dispenser can be mounted on the gas dispenser for the rinse; however, it is also possible that the dispenser for process liquid and rinse liquid is the same.

The dispensing of inert gas through nozzle 12 and showerhead 15 can also be independently controlled by equipping the gas dispenser 6 with suitable valves for placing either or both of the outlets in communication with inlets 9. This therefore gives rise to each of the following possible operating modes, each of which can be performed either with or without simultaneously dispensing of process liquid through nozzle 16:

(1) Gas dispense from annular nozzle only;
(2) Gas dispense from showerhead screen only;
(3) Gas dispense from annular nozzle and showerhead screen in parallel.

The operating mode (3) is presently preferred. In particular, preferred operating ranges are those in which between 1-50% of the total $N_2$ flow is dispensed via showerhead screen 15 and between 50-99% of the total $N_2$ flow is dispensed via annular nozzle 12. The total $N_2$ flow is preferably between 1 and 1000 lpm (liters per minute).

A typical process sequence according to an embodiment of the present method comprises the following steps, performed in the order listed:

1) load wafer on chuck and start rotation;
2) move dispenser over the wafer at a defined distance "d";
3) start $N_2$ dispense to reduce the oxygen content between wafer and dispenser;
4) start liquid dispense while continuing the $N_2$ dispense;
5) rinsing;
6) drying (conducted for example by spinning, which can be aided by isopropanol vapor carried by an inert gas), and ceasing the $N_2$ dispensing when the wafer is dry;
7) move dispenser to "park" position (not overlapping wafer); and
8) stop rotation and unload wafer.

In the above sequence Step 3} can precede Step 4) or can commence simultaneously with Step 4). During step 5) (rinse) the $N_2$ dispense can be continued. Furthermore, steps 4) and 5) can be repeated multiple times as required by the nature of the workpiece to be processed.

Figure 4:
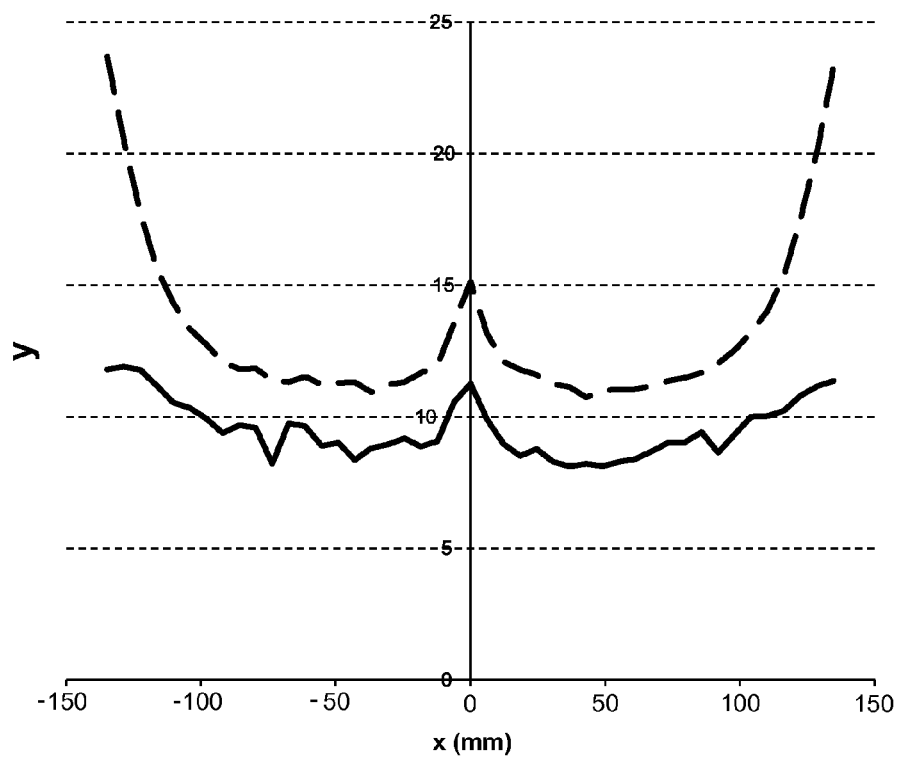
FIG. 4 is a graph showing the percentage of copper loss across a 300 mm wafer process according to an embodiment of the method and apparatus according to the invention, contrasted with the result obtained for a wafer processed without utilizing the gas dispenser according to the invention.

As can be seen in FIG. 4 the copper etch uniformity across the wafer can be dramatically improved and the copper loss at the peripheral area (near the wafer edge) can be reduced by about 50%. The y-axis in FIG. 4 is the copper loss after etching expressed as a percentage reduction in thickness, whereas the x-axis in FIG. 4 is the diameter distribution for a 300 mm wafer. The dashed line in FIG. 4 shows the percentage of copper loss without inert-gas purge through the showerhead, whereas the solid line shows the copper loss using the inert-gas purge through the showerhead.

The present inventors have discovered that the ability to move the gas dispenser laterally in relation to the wafer helps to improve etch uniformity. Furthermore, despite the relatively small size of the gas dispenser relative to the workpiece, a completely closed process pot is not required.

While the present invention has been described in connection with various illustrative embodiments thereof, it is to be understood that those embodiments should not be used as a pretext to limit the scope of protection conferred by the true scope and spirit of the appended claims.

What is claimed is:

1. A method for processing wafer shaped articles, comprising:
    positioning a wafer-shaped article on a holder;
    positioning a gas dispenser above the wafer-shaped article at a defined operating distance;
    dispensing an inert gas above the wafer-shaped article;
    dispensing an etching liquid onto the wafer-shaped article simultaneously with said dispensing an inert gas above the wafer-shaped article; and
    moving the gas dispenser laterally relative to the wafer-shaped article while dispensing said inert gas;
    wherein the etching liquid is dispensed from a nozzle carried by the gas dispenser.

2. The method according to claim 1, wherein the gas dispenser has a size such that it overlaps the wafer-shaped article in an area that is from 5 to 50% of an area of an upwardly facing surface of the wafer-shaped article.

3. The method according to claim 1, wherein said dispensing of an inert gas above the wafer-shaped article comprises dispensing inert gas through an annular nozzle in a direction substantially parallel to an upwardly-facing surface of the wafer-shaped article.

4. The method according to claim 1, wherein said dispensing of an inert gas above the wafer-shaped article comprises dispensing inert gas through a plurality of downwardly directed gas outlets configured to dispense inert gas downwardly toward the wafer-shaped article.

5. The method according to claim 1, wherein said dispensing of an inert gas above the wafer-shaped article comprises dispensing inert gas through an annular nozzle in a direction substantially parallel to an upwardly-facing surface of the wafer-shaped article, and dispensing inert gas through a plurality of downwardly directed gas outlets configured to dispense inert gas downwardly toward the wafer-shaped article.

6. The method according to claim 5, wherein inert gas is dispensed through the annular nozzle via outlets surrounding and directed outwardly of the plurality of downwardly directed gas outlets.

* * * * *